United States Patent [19]
Ohba et al.

[11] 4,267,469
[45] May 12, 1981

[54] SOLID-STATE IMAGING DEVICE HAVING A CLAMPING CIRCUIT FOR DRAWING OUT EXCESS CHARGE

[75] Inventors: Shinya Ohba, Kokubunji; Iwao Takemoto, Kodaira; Masaaki Nakai, Hachioji; Haruhisa Ando, Kokubunji; Masaharu Kubo, Hachioji, all of Japan

[73] Assignee: Hitachi, Ltd., Japan

[21] Appl. No.: 66,880

[22] Filed: Aug. 16, 1979

[30] Foreign Application Priority Data

Aug. 17, 1978 [JP] Japan .......................... 53-111974[U]

[51] Int. Cl.³ .................. H03K 3/42; H01L 29/78; H01L 27/14; H01L 31/00
[52] U.S. Cl. ................. 307/311; 307/221 D; 357/24; 357/30
[58] Field of Search .............. 357/24, 30; 307/221 D, 307/311

[56] References Cited

U.S. PATENT DOCUMENTS

| | | | |
|---|---|---|---|
| 3,715,485 | 2/1973 | Weimer | 357/24 |
| 4,155,094 | 5/1979 | Ohba et al. | 357/24 |

*Primary Examiner*—Gene M. Munson
*Attorney, Agent, or Firm*—Craig & Antonelli

[57] ABSTRACT

In a solid-state imaging device having on an identical semiconductor substrate a plurality of photodiodes which are arrayed in two dimensions, vertical and horizontal switching MOSFETs which select the positions of the photodiodes, and vertical and horizontal scanning circuits which provide scanning pulses for controlling the operations of the vertical and horizontal switching MOSFETs; the improvement therein comprising a clamping circuit which is made up of a diode, a MOSFET or the like and which is disposed between the photodiode and a vertical scanning line of the succeeding stage, so that excess charges overflowing the photodiode are drawn out from the vertical scanning line through the clamping circuit, whereby the blooming can be prevented.

8 Claims, 15 Drawing Figures

SOLID-STATE IMAGING DEVICE HAVING A CLAMPING CIRCUIT FOR DRAWING OUT EXCESS CHARGE

BACKGROUND OF THE INVENTION

1. Field of the Invention

This invention relates to a solid-state imaging device for use in a television camera etc. Particularly, it relates to a solid-state imaging device which has a plurality of picture elements disposed in a surface region of a semiconductor body. More specifically, it relates to a solid-state imaging device which has picture elements for reading out from photodiodes photo information stored therein.

2. Description of the Prior Art

FIG. 1 is a principle diagram of a prior-art solid-state area sensor. The sensor comprises a photosensitive portion which consists of a large number of photodiodes 1 arrayed in the form of a matrix, vertical switching insulated-gate field effect transistors (hereinbelow, written "MOSFETs") 2 and horizontal switching MOSFETs 3 which serve to read out optical signals stored in the photodiodes 1, and a shift register 4 of a vertical scanning circuit and a shift register 5 of a horizontal scanning circuit which serve to change-over the respective switches in good order. Numeral 6 designates a vertical scanning line, numeral 7 a vertical signal output line, numeral 8 a horizontal scanning line, numeral 9 a horizontal signal output line, numeral 10 an output terminal, numeral 11 an output load resistance, and numeral 12 a voltage source for video outputs. The vertical and horizontal switching MOSFETs effect the switching operations in such a manner that scanning pulses derived from the outputs of the respective stages of the shift registers are impressed on the gates of the MOSFETs.

In this solid-state imaging device, in the photodiode 1 on which intense light with incident photons exceeding a predetermined quantity is impinging, charges to be stored are more than the saturation amount and overflow the vertical signal output line 7, to affect the readout of the other photodiodes 1 connected with the identical vertical signal output line 7. This gives rise to the phenomenon called "blooming" in which white stripe lines appear on a picture screen, so that the picture quality is conspicuously degraded.

As a countermeasure against this drawback, there has been one wherein a MOSFET for drawing excess charges the source of which is connected to the photodiode 1 is disposed and wherein a control line for a bias voltage and an absorptive line for excess charges are respectively connected to the gate and drain of the FET. Since, however, the area of the solid-state imaging device is fixed, the addition of such elements and wirings decreases the area of the photodiodes to that extent, resulting in lowering the sensitivity. Particularly, the gate voltage control lines and the excess charge absorptive lines occupy large areas and drastically degrade the sensitivity.

Further, according to a solid-state imaging device employing an overflow drain which has been developed as a more advanced measure, the photodiode 1 is provided with a MOSFET separately from the switching MOSFETs, and the excess charges are let escape through this MOSFET with a predetermined D.C. bias voltage applied to the drain thereof. Accordingly, an additional absorptive line for excess charges is also required in this device, so that the area of the photodiode decreases to lower the incident photon efficiency and to reduce the saturation charges.

SUMMARY OF THE INVENTION

An object of this invention is to equip a solid-state imaging device with means for preventing the blooming phenomenon without decreasing the area of a photoelectric element such as photodiode.

Another object of this invention is to construct means for preventing the blooming in a solid-state imaging device, the means making it unnecessary to dispose an absorptive line for excess charges or any other control line anew.

In sum, it is the object of this invention to provide a practical solid-state imaging device of high picture quality, high resolution and high integration density which is equipped with means for suppressing the blooming phenomenon attributed to the incidence of intense light.

In the solid-state imaging device of this invention, an absorptive line for excess charges is also used as a vertical scanning line, thereby to prevent the degradation of the picture quality and bad influence on the enhancement of the integration density. Concretely, the solid-state imaging device of this invention comprises a clamping circuit composed of a diode or transistor between a photodiode and a vertical scanning line of the next stage.

DETAILED DESCRIPTION OF THE INVENTION

Figure 2:
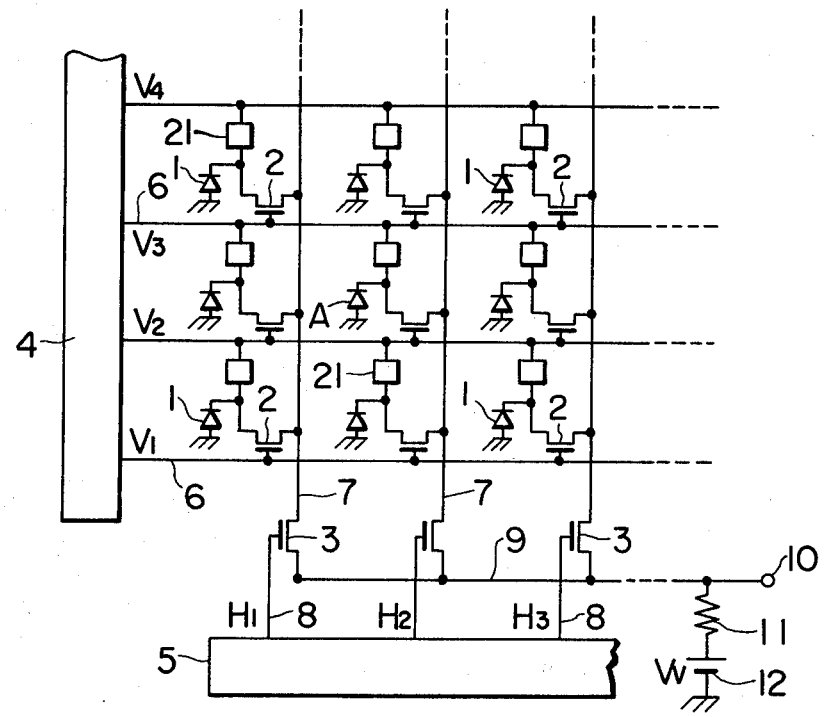
FIG. 2 is a schematic circuit diagram showing a solid-state imaging device according to this invention.

FIG. 2 is a diagram for explaining this invention.

Figure 3:
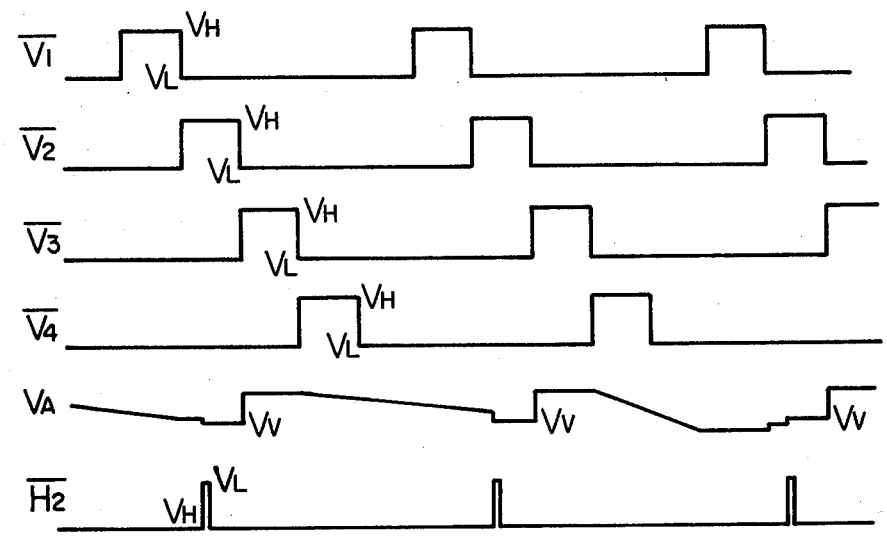
FIG. 3 is a pulse timing chart showing the relationship among a horizontal scanning pulse $H_i$, a vertical scanning pulse $V_i$, and the voltage of a photodiode A in the solid-state imaging device illustrated in FIG. 2.

Referring to the figures, numeral 1 designates a photodiode, numeral 2 a vertical switching MOSFET, numeral 3 a horizontal switching MOSFET, numeral 4 a shift register of a vertical scanning circuit, numeral 5 a shift register of a horizontal scanning circuit, numeral 6 ($V_1, V_2, \ldots$) a vertical scanning line, numeral 7 a vertical signal output line, numeral 8 ($H_1, H_2, \ldots$) a horizontal scanning line, numeral 9 a horizontal signal output line, numeral 10 an output terminal, numeral 11 an output load resistance, and numeral 12 a voltage source for a video output. As shown in FIG. 3 which is a pulse timing chart, the shift register 4 of the vertical scanning circuit provides pulses in the order of $\overline{V}_1, \overline{V}_2, \overline{V}_3, \overline{V}_4, \ldots$ in time, while the shift register 5 of the horizontal scanning circuit provides pulses in the order of $\overline{H}_1, \overline{H}_2, \overline{H}_3, \ldots$.

Figure 1:
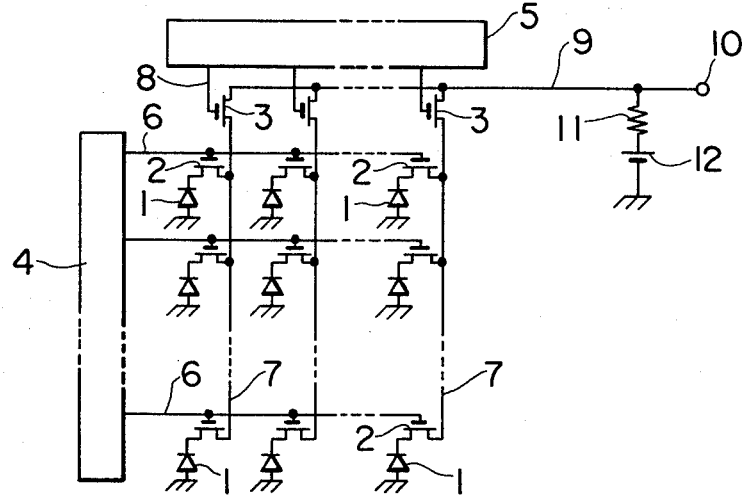
FIG. 1 is a schematic circuit diagram showing a solid-state area sensor.

These are the same as in the example of the prior art in FIG. 1. In this invention, a clamping circuit 21 formed of a diode or transistor is disposed between the photodiode 1 which is read out by the vertical switching MOSFET connected to the i-th vertical scanning line $V_i$ and the (i+1)-th vertical scanning line $V_{i+1}$ of the succeeding stage. Here, when the photodiode 1 of the i-th stage has become a potential which is lower than that of the vertical scanning line 6 of the (i+1)-th stage by the threshold voltage $V_{TD}$ of the clamping circuit 21, the particular photodiode 1 and the vertical scanning line 6 of the succeeding stage are connected. In other cases, especially in case where the voltage of the vertical scanning line 6 is lower than that of the photodiode 1, the photodiode and the vertical scanning line are turned electrically "off".

Figure 4A:
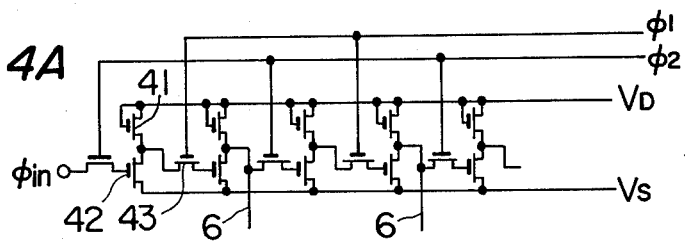
FIG. 4A is a circuit diagram showing a first example of construction for a shift register of a vertical scanning circuit for use in the solid-state imaging device of this invention.
Figure 4B:
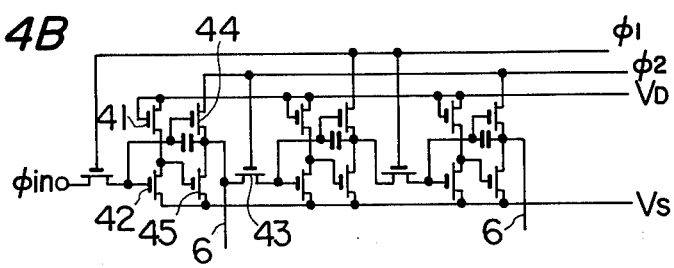
FIG. 4B is a circuit diagram showing a second example of construction for the shift register of the vertical scanning circuit for use in the solid-state imaging device of this invention.
Figure 4C:
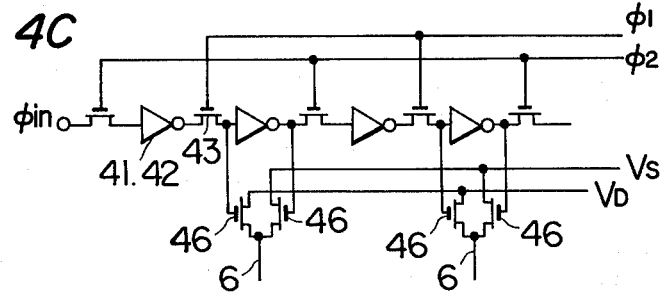
FIG. 4C is a circuit diagram showing a third example of construction for the shift register of the vertical scanning circuit for use in the solid-state imaging device of this invention.

The shift register 4 of the vertical scanning circuit is put into a circuit arrangement with which, when the vertical switching MOSFET 2 is brought into the "off" state, the line connected to the gate thereof is connected to an external power source of, e.g., about 1 V or to the earth with a low impedance. Such circuit arrangements are shown in FIGS. 4A-4C. The circuit arrangement in FIG. 4A has heretofore been known well. It is made up of inverter circuits each consisting of MOSFETs 41 and 42, and transfer gate circuits each consisting of a MOSFET 43. Clock pulses $\overline{\phi}1$ and $\overline{\phi}2$ in two phases are alternately applied to the transfer gate circuits from respective lines $\phi_1$ and $\phi_2$. $V_D$ indicates a power supply line, $V_S$ an earth line, and $\phi_{in}$ an input pulse terminal. As the solid-state imaging device, pulses from output lines indicated at 6 in the figure are employed for the vertical scanning pulses. The example of FIG. 4B is such that each inverter is provided with a source follower in a bootstrap circuit arrangement consisting of MOSFETs 44 and 45. It is made immune to level fluctuations and voltage fluctuations so as to eliminate waveform variations, especially amplitude variations, of the respective outputs. FIG. 4C illustrates an example of a circuit in the case where it is desired to convert the high and low levels of the vertical scanning pulse into the voltages $V_D$ and $V_S$ respectively. When transistors 46 are operated in a non-saturation region, the variations of the low and high levels of the respective output pulses can be eliminated.

Hereunder, the operation of the device of this invention will be described with reference to FIGS. 2 and 3 and by taking note of the photodiode A in FIG. 2.

Now, let $V_H$ and $V_L$ denote the high level of the horizontal scanning pulse $H_i$ and the low level of the vertical scanning $V_i$ respectively. Also, let $V_V$ denote the video bias voltage of the output terminal. Concretely, it is supposed that $V_H = 9$ V, $V_L = 1$ V and $V_V = 1$ V. As other numerical values, it is assumed that the threshold voltage $V_{TD}$ of the clamping circuit 21 is 0.5 V and that the threshold voltage $V_{TE}$ of the vertical switching MOSFET is 1.5 V. For the sake of simplicity, the MOSFETs are assumed to be of the N-channel type and to have no substrate bias effect.

(1) When the vertical scanning pulse $\overline{V}_2$ is provided and the horizontal scanning pulse $\overline{H}_2$ is also provided, signal charges stored in the photodiode A are read out to the output terminal 10, and the photodiode A is set to the video voltage $V_V (= 1$ V).

(2) When the vertical scanning pulse $V_3$ is subsequently provided, the line $V_3$ becomes the high potential of $V_H (=9$ V), so that the clamping circuit 21 falls into the conductive state and that the photodiode A is reset or precharged to the following voltage:

$$V_R = V_H - V_{TD} \qquad (1)$$

In this case, $V_H = 9$ V and $V_{TD} = 0.5$ V. Therefore, $$V_R = 8.5 \text{ V}$$

and the photodiode A is reset to 8.5 V. The same operation as described above is effected in the photodiodes which lie in the same row as that of the photodiode A.

(3) Upon turning-off of the vertical scanning pulse $V_3$, the line $V_3$ becomes the voltage $V_L (= 1$ V) which is lower than the voltage of the photodiode A, so that the clamping circuit 21 turns "off". At this time, also the vertical switching MOSFET 2 is "off". Accordingly, the storage of signal charges begins at the point of time when the vertical scanning pulse $V_3$ has turned "off".

(4) The storage of the signal charges proceeds till a time immediately before the vertical scanning pulse $\overline{V}_2$ is provided in the next cycle (frame), and the potential $V_A$ of the photodiode A lowers depending upon incident light.

(5) In case of such extent of incident light that the blooming is not induced, when the vertical scanning pulse $\overline{V}_2$ is provided and also the horizontal scanning pulse $\overline{H}_2$ is provided, the signal charges are delivered and the photodiode A is set to the video voltage $V_V (= 1$ V).

(6) With the prior-art device, in case where the intense light as causes the blooming has entered, the potential of the photodiode A lowers on and on to come closer to a potential obtained by subtracting the built-in potential $V_{bi}$ of the junction diode (0.6 V) from the substrate potential $V_{SUB}$ (=0 V).

(7) In this regard, in the device of the invention, the potential of the vertical scanning line 6 is $V_L$ (=1 V). Therefore, when the photodiode A intends to become lower than:

$$V_C = V_L - V_{TD} \qquad (2)$$

the clamping circuit 21 operates, so that the excess charges are absorbed by the vertical scanning line 6 of the succeeding stage and that the photodiode A is clamped to the potential $V_C$ in Equation (2). Since, in this case, $V_L = 1$ V and $V_{TD} = 0.5$ V, the potential $V_C$ is:

$$V_C = 0.5 \ V$$

When the pulse $\overline{V}_2$ is subsequently provided, the photodiode A is set to the video voltage, and the signal charges are delivered.

The above is the operating principle of the device of this invention, according to which the predetermined overflow drain operation becomes possible without requiring a separate wiring.

Figures 5A, 5B, 5C, 5D:
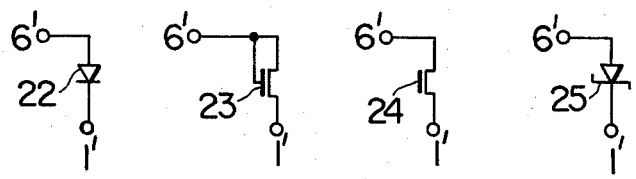
FIG. 5A is a schematic illustration of an example of a clamping circuit for use in the solid-state imaging device of this invention, the example employing a P-N junction diode.
FIGS. 5B and 5C are schematic illustrations of examples of the clamping circuit for use in the solid-state imaging device of this invention, each of the examples employing a MOSFET.
FIG. 5D is a schematic illustration of an example of the clamping circuit for use in the solid-state imaging device of this invention, the example employing a Schottky barrier diode.

Referring back to the clamping circuit 21, FIGS. 5A, 5B, 5C and 5D illustrate elements which can form the clamping circuits. FIG. 5A shows a P-N junction diode 22, FIG. 5B a MOSFET 23, FIG. 5C a punch-through transistor (MOSFET having no gate bias) 24, and FIG. 5D a Schottky barrier diode 25. In all the figures, 6' indicates the vertical scanning line side, and 1' the photodiode side. All the illustrated examples of FIGS. 5A–5D concern an Si sensor employing N-channel MOSFETs. In an Si sensor employing P-channel MOSFETs, the polarities of the diodes in FIGS. 5A and 5D are opposite.

By applying any of the circuit elements in FIGS. 5A–5D to the clamping circuit 21 in FIG. 21, this invention can be realized.

Figure 6:
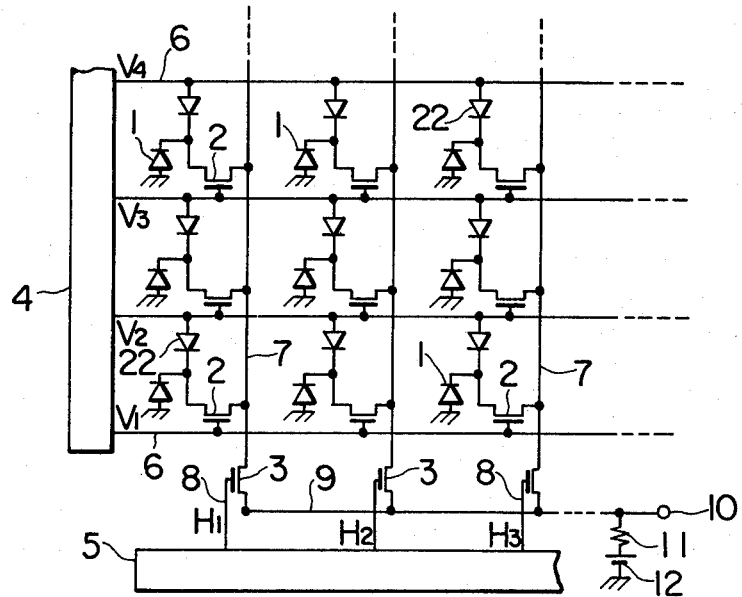
FIG. 6 is a circuit diagram showing an embodiment of the solid-state imaging device of this invention which is constructed by employing the clamping circuit formed of a diode.
Figure 7:
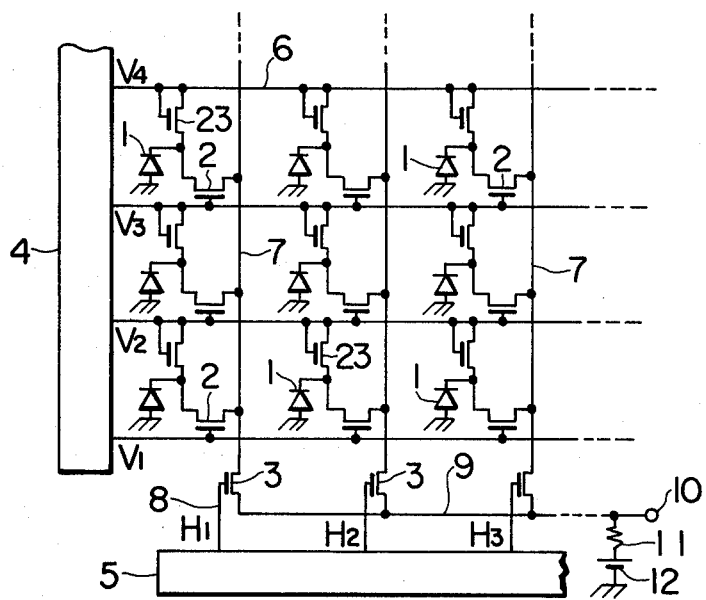
FIG. 7 is a circuit diagram showing an embodiment of the solid-state imaging device of this invention which is constructed by employing the clamping circuit formed of a MOSFET.

FIGS. 6 and 7 are diagrams showing embodiments of this invention in the cases where the P-N junction diode 22 in FIG. 5A and the MOSFET 23 in FIG. 5B are respectively used as the clamping circuits 21 in FIG. 2.

As understood from Equation (2), in both the cases, it is more effective that the substrate voltage $V_{SUB}$ is lower than the voltage $V_C$ in Equation (2). That is, it is of course more desirable to hold the following condition:

$$V_{SUB} \leq V_L - V_{TD} \qquad (3)$$

Figure 8:
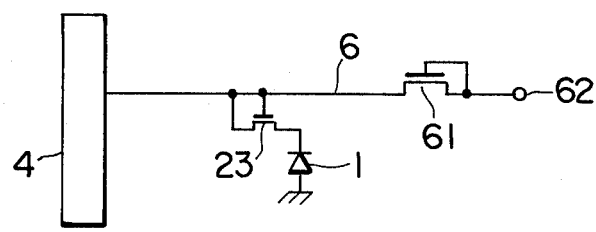
FIG. 8 is a schematic circuit diagram showing an embodiment of the solid-state imaging device of this invention in which a clamping circuit is also incorporated in a vertical scanning line.

In case of the incidence of the intense light, charges attributed to the blooming flow into the vertical scanning line 6 through a clamping circuit 23 shown in FIG. 8. Accordingly, the capability of absorbing the charges is required of the shift register 4 of the vertical scanning circuit. In view of the circuit system, however, the aforecited condition is not always fulfilled. In such case, a clamping circuit 61 may be incorporated in the vertical scanning line 6 as shown in FIG. 8. Here, this clamping circuit is constructed of a MOSFET. The charges ascribable to the blooming are absorbed out of a terminal 62 through the clamping circuit 61. Thus, the shift register of the vertical scanning circuit is not adversely affected at all, and it does not require any special capability, either. The terminal 62 is connected to the earth or to an external power source whose voltage is greater than the threshold voltage of the clamping circuit 61.

As apparent from the above detailed description, in accordance with this invention, the excess charges which form the cause for the blooming can be taken out without providing any additional wiring for taking out the excess charges overflowing the photodiode.

Figure 9:
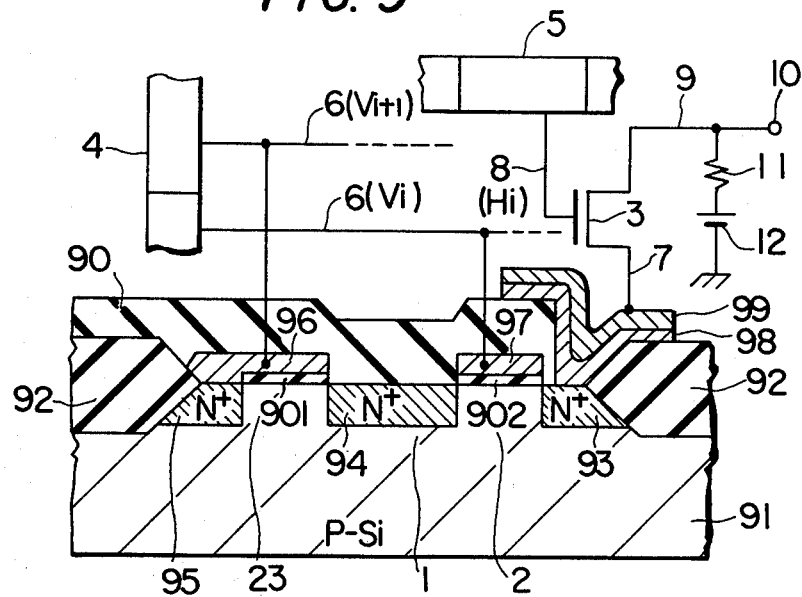
FIG. 9 is a sectional view showing the element construction of a picture element region including a photodiode, a vertical switching MOSFET and the clamping circuit at the time when the solid-state imaging device of this invention shown in FIG. 7 is put into an integrated circuit.

FIG. 9 shows an element-sectional view of a region (a region corresponding to one picture element) including the vertical switching MOSFET 2, the photodiode 1 and the clamping circuit at the time when the solid-state imaging device of the embodiment shown in FIG. 7 is constructed as an integrated circuit. In FIG. 9, numeral 91 designates an Si substrate of the P-type conductivity which has an impurity density of $1 \times 10^{15} - 2 \times 10^{16}/cm^3$, and numeral 92 a thick (1 $\mu$m or so) insulating film (of SiO$_2$ or the like) which isolates the adjoining picture element regions. Numerals 93 and 94 designate N$^+$-type impurity regions (having an impurity density of $10^{19} - 10^{20}/cm^3$) which serve as the drain and source of the vertical switching MOSFET respectively. The P-N junction photodiode 1 is constructed of the N$^+$-type region 94 and the P-type substrate 91. Numerals 902 and 97 indicate the gate insulating film (made of SiO$_2$ or the like, having a thickness of about 750 Å) and gate electrode (made of polycrystalline Si or the like, having a sheet resistance of 15–20Ω) of the vertical switching MOSFET 2, respectively. The MOSFET 23 which forms the clamping circuit is made up of N$^+$-type impurity regions (having an impurity density of $10^{19} - 10^{20}/cm^3$) 94 and 95 respectively serving as drain and source regions, a gate insulating film (made of SiO$_2$ or the like, having a thickness of about 750 Å) 901, and a gate electrode (made of polycrystalline Si or the like, having a sheet resistance of 15–20Ω) 96. In FIG. 9, numeral 98 indicates a polycrystalline Si layer (having a sheet resistance of 30Ω) and numeral 99 an Al layer, and a double-layer electrode consisting of these layers makes up the vertical signal output line 7. Shown at 90 in FIG. 9 is a PSG (phosphosilicate glass) film.

Figure 10:
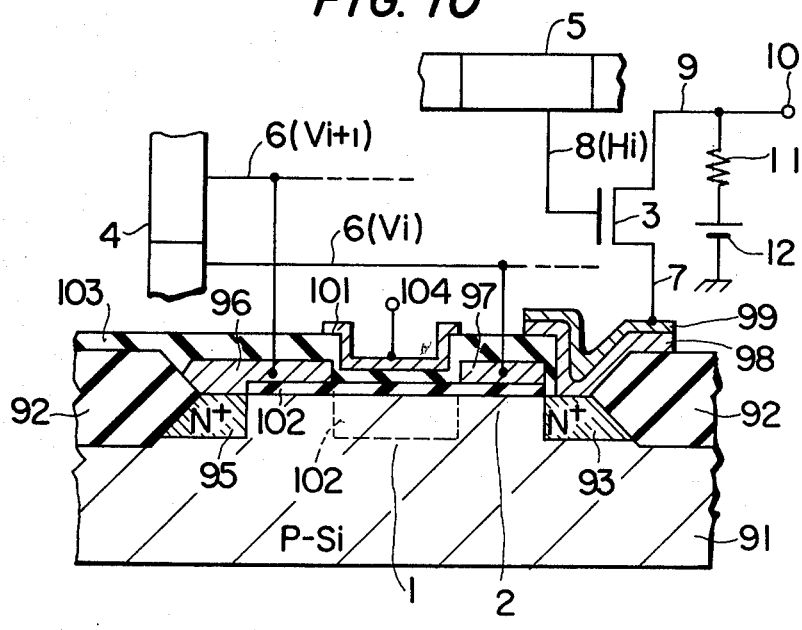
FIG. 10 is a sectional view showing an element construction at the time when, in the element construction of FIG. 9, the photodiode is replaced with a MIS (metal-insulator-semiconductor) structure element.

FIG. 10 shows a device in which an inversion layer based on an insulated-gate structure (MOS structure) is utilized for the photodiode 1 in the picture element construction illustrated in FIG. 9. In FIG. 10, numeral 101 designates a gate electrode (transparent electrode made of SnO$_2$, polycrystalline Si or the like), numerals 102 and 103 gate insulating films (made of SiO$_2$ or the like), and numeral 104 a voltage terminal for biasing the gate electrode of the MOS structure. When the MOS structure element is employed as the photodiode as in the device of FIG. 10, there are the advantages that charges in the case of resetting the photodiode 1 are little varied and that the signal-to-noise ratio is enhanced.

As understood from the above detailed description, this invention can provide the solid-state imaging device which can draw out the excess changes forming the cause for the blooming, without the necessity for disposing any additional wiring for absorbing the excess charges overflowing the photodiode.

What is claimed is:

1. In a solid-state imaging device having a plurality of photo elements which are arrayed in a horizontal (row) direction and a vertical (column) direction; vertical switching elements which correspond to the respective photo elements; a first line which connects in common, output terminals of the vertical switching elements existent on an indentical column; horizontal switching elements which are connected to the first lines; an output line which connects in common, output terminals of said horizontal switching elements; a second line which connects in common, control terminals of the vertical switching elements existent on an identical row; a horizontal scanning circuit which impresses horizontal scanning pulses on control terminals of said horizontal switching elements; and a vertical scanning circuit which impresses vertical scanning pulses on said control terminals of said vertical switching elements through the second lines; a solid-state imaging device comprising the fact that each of the photo elements is additionally provided with a clamping circuit for drawing out excess charges, an output terminal of which is connected to the second line of a succeeding stage.

2. A solid-state imaging device according to claim 1, wherein said clamping circuit is constructed of an element selected from the group consisting of a P-N junction diode, a MOSFET, a punch-through transistor and a Schottky barrier diode.

3. A solid-state imaging device according to claim 2, wherein said photo elements, said horizontal switching elements, said vertical switching elements, said horizontal scanning circuit, said vertical scanning circuit and the clamping circuits are disposed in a surface region of a semiconductor body of a first conductivity type.

4. A solid-state imaging device according to claim 3, wherein said photo element is a P-N junction diode which is constructed of said semiconductor body and an impurity region of a second conductivity type (opposite to said first conductivity type) serving either of a source and drain of an insulated-gate field effect transistor serving as said vertical switching element.

5. A solid-state imaging device according to claim 3, wherein said photo element is an insulated-gate structure element, and its portion for receiving light is an inversion layer formed under a gate electrode of said insulated-gate structure element.

6. A solid-state imaging device according to claim 4 or claim 5, wherein letting $V_L$ denote a low level voltage of the vertical scanning pulse, $V_{TD}$ denote a threshold voltage of said clamping circuit, and $V_{SUB}$ denote a substrate voltage of said semiconductor body, the following condition is met:

$$V_{SUB} \leq V_L - V_{TD}.$$

7. A solid-state imaging device according to claim 1, claim 2, claim 3, claim 4 or claim 5, wherein said second line is connected through either of an earth terminal and an external power source, and a second clamping circuit.

8. A solid-state imaging device according to claim 1, claim 2, claim 3, claim 4 or claim 5, wherein said vertical scanning circuit has a function of connecting said second line to either of an external power source or an earth terminal when said vertical switching element is brought into an "off" state by the vertical scanning pulse.

* * * * *